(12) United States Patent
Huang

(10) Patent No.: US 10,211,252 B2
(45) Date of Patent: Feb. 19, 2019

(54) MULTISPECTRAL IMAGING DEVICE AND IMAGING SYSTEM

(71) Applicant: EXPANTRUM OPTOELECTRONICS, Shanghai (CN)

(72) Inventor: Zhongshou Huang, Shanghai (CN)

( * ) Notice: Subject to any disclaimer, the term of this patent is extended or adjusted under 35 U.S.C. 154(b) by 0 days.

(21) Appl. No.: 15/809,010

(22) Filed: Nov. 10, 2017

(65) Prior Publication Data

US 2018/0358399 A1    Dec. 13, 2018

(30) Foreign Application Priority Data

Jun. 13, 2017  (CN) .......................... 2017 1 0441944

(51) Int. Cl.
*H01L 27/146* (2006.01)

(52) U.S. Cl.
CPC .. *H01L 27/14652* (2013.01); *H01L 27/14621* (2013.01); *H01L 27/14645* (2013.01)

(58) Field of Classification Search
CPC ......... H01L 27/14652; H01L 27/14621; H01L 27/14645
See application file for complete search history.

(56) References Cited

U.S. PATENT DOCUMENTS

| 8,848,047 B2 * | 9/2014 | Inuiya | H04N 5/332 348/164 |
| 2017/0162618 A1 * | 6/2017 | Ooki | H01L 27/14605 |

* cited by examiner

*Primary Examiner* — Marcus H Taningco

(57) ABSTRACT

The present disclosure provides a multispectral imaging device and imaging system. The multispectral imaging device comprises: a substrate; a plurality of semiconductor layers, stacked on the substrate and arranged in a direction perpendicular to the substrate, different semiconductor layers converting visible light photons and NIR light photons to electrons, respectively; and a filtering layer, arranged on one side of the plurality of semiconductor layers away from the substrate, comprising a plurality of filtering sections arranged as a matrix, to separate the incident light to multiple wavebands on a plane parallel to the substrate. The multispectral imaging device and imaging system separate the incident light by waveband in a direction perpendicular to the substrate and a direction parallel to the substrate, then multispectral images can be acquired at the same time.

17 Claims, 9 Drawing Sheets

MULTISPECTRAL IMAGING DEVICE AND IMAGING SYSTEM

CROSS REFERENCE

This application is based upon and claims the benefit of priority from Chinese Patent Application No. 201710441944.6 filed on Jun. 13, 2017, the entire contents thereof are incorporated herein by reference.

TECHNICAL FIELD

The present disclosure belongs to the field of medical diagnosis instrument, specifically to a multispectral imaging device and imaging system.

BACKGROUND

Subcutaneous structure and blood vessels under skin are barely visible for naked eyes directly. Without any medical instrument, medical doctors can only rely on the external outline of human body and their anatomic knowledge to recognize and locate subcutaneous structures and blood vessels.

The blood vessels, comprising veins and arteries, are hidden below the epidermis and dermis, and in some cases mixed with the subcutaneous fat or are even behind the bones. Images of the blood vessels under the visible light illumination are therefore extremely faint and barely visible for naked eyes. Before puncture, the doctors often try to make the blood vessels more visible by asking the patients to clench their fist or flapping the skin above the blood vessel, but hindered by patients' age and the thickness of subcutaneous fat and etc., the visibility of subcutaneous blood vessels is still not satisfying in most case. Injections relying on the barely visible images of blood vessels frequently results misalignment of the puncture, causing unnecessary pain in patients and delaying optimal time for medical treatment, even triggering other serious side effect. Apart from blood drawing and injection acted on blood vessels directly, acupuncture and other medical surgery etc. all need the blood vessels to be located accurately, so the blood vessels can be avoided or be treated separately.

In recent years, a technical approach for solving the problem based on near-infrared (NIR) imaging technology has been proposed. This technical approach is based on the fact that the absorption coefficient of hemoglobin for near infrared light from 760 nm and 1000 nm is different from that of other human tissues around the veins, so image contrast is built up. To implement this technical approach, NIR images of veins are acquired in the first step, then the infrared image is digitized and enhanced in contrast and signal to noise ratio by an image processing unit, enhanced image is finally projected back to human skin surface by a visible light projection device. In this technical approach, which has augment reality effect in a broad meaning, the doctors and nurses are able to recognize and locate precisely the subcutaneous blood vessels and conduct various medical treatments and operate in real time.

However, the subcutaneous blood vessels are surrounded by subcutaneous fat and muscular tissues, inevitably causing strong scattering to the infrared image. To add more obstacles, wrinkles, scars and hairs on the skin surface all have strong absorption and scattering effects to attenuate and blur the infrared image. These drawbacks become severe when imaging objects are narrow branches of blood vessels and capillaries. This is simply because that less blood e and therefore less hemoglobin are in the infrared light path, while the light scatterings from surrounding tissues remain the same, resulting less absorption and faint contrast in infrared image. Under the influence of scattering light, the image contrast of the blood vessels to the surrounding tissues is often observed in the range of 0.01~0.1.

Considering the optical characteristic of subcutaneous soft tissues, the absorption depths of subcutaneous layer to different light wavebands are different, in the way of a penetrated depth increasing with the wavelength. The visible light waveband ranging from 420 nm in a color of violet to 550 nm most sensitive to eyes can only penetrate 0.6 mm of epidermis layer, while the red light waveband larger than 690 nm can penetrate epidermis and corium layers to irradiate subcutaneous tissues and partial veins. NIR light waveband ranging from 760 nm to 1000 nm barely visible for naked eyes can irradiate deeper subcutaneous tissues and fat layer.

When irradiating the skin, scattered light and reflected light from skin surface will cause interference or noise to images of subcutaneous blood vessels. An image only showing deeper subcutaneous layers can be extracted by removing visible light image information from an original image, which is principle of digital subtraction technology of infrared light image. Hindered by the processing ability of analog signals, the images are needed to be processed in digitized form by computers.

SUMMARY

The primary purpose of the present disclosure is to provide a multispectral imaging device and imaging system to overcome the difficulty of existing technology and acquire images of different wavebands effectively and accurately.

According to one aspect of the present disclosure, a multispectral imaging device is provided, to acquire multispectral images. The multispectral imaging device comprises: a substrate; a plurality of semiconductor layers, stacked on the substrate and arranged following a direction perpendicular to the substrate, different semiconductor layers separately converting visible light and NIR light photons to electrons; and a filtering layer, arranged on one side of the plurality of semiconductor layers away from the substrate, comprising a plurality of filtering sections arranged as a matrix, to separate the incident light to multiple wavebands on a plane parallel to the substrate.

Therefore, the multispectral imaging device and multispectral imaging system of the present disclosure separate the incident light into a plurality of light beams in multiple wavebands in a direction perpendicular to the substrate and in a direction parallel to the substrate, and then acquire images in multiple wavebands in real tune and respectively.

BRIEF DESCRIPTION OF THE DRAWINGS

By reading the detailed description of nonrestrictive embodiment referring to the figures below, the other features, objects and advantages will be more apparent.

DETAILED DESCRIPTION

Figure 1:
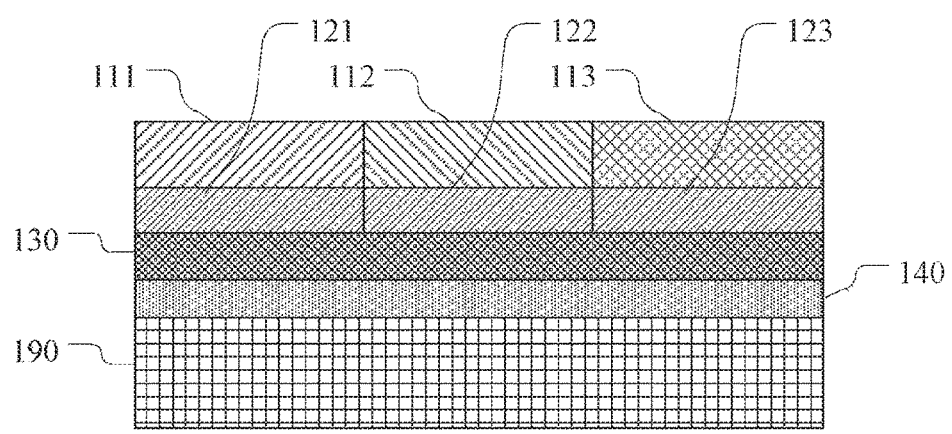
FIG. 1 is a cross-sectional view of a multispectral imaging device according to a first embodiment of the present disclosure.

In the following, embodiments of the present disclosure will be described in detail referring to figures. The concept and its realizations of the present disclosure may be implemented in a plurality of forms, and should not be understood to be limited to the embodiments described hereafter. On the contrary, these embodiments are provided to make the present disclosure more comprehensive and understandable, and so the conception of the embodiments may be conveyed to the person skilled in the art fully. Same reference numbers in the figures refer to same or similar structures, so repeated description of them will be omitted.

The features, structures or characteristics described may be combined in any appropriate way in one or more embodiments. In the description below, many specific details are provided to explain the embodiments of the present disclosure fully. However, the person skilled in the art should realize that, without one or more of the specific details, or adopting other methods, components, materials etc., the technical approach of the present disclosure may still be realized. In certain conditions, structures, materials or operations well known are not shown or described in detail so as not to obfuscate the present disclosure.

To overcome the drawbacks of existing technology, the present disclosure provides a multispectral imaging device to acquire images in multiple wavebands. The multispectral imaging device comprises a substrate; a plurality of semiconductor layers stacked on the substrate and a filtering layer arranged on one side of the semiconductor layers away from the substrate. Different semiconductor layers convert visible light and NIR light photons to electrons, separately. The filtering layer comprises a plurality of filtering sections arranged as a matrix, to separate incident light according to multiple wavebands on a plane parallel to the substrate.

Due to correlation between absorption depths and wavelengths of the light absorbed by semiconductor materials, images in multiple wavebands are separated in different depths along the light path, which is perpendicular to the substrate. On the other hand, due to color filter matrix layer, images in multiple wavebands are farther separated on a two dimensional plane in parallel to the substrate. As a result, the multispectral images are separated according to wavebands in a three dimensional space at the same time. When light irradiates skins, as light is absorbed, reflected and scattered continuously under the skin along the light paths, the reflected light will carry information mixed with multiple image layers. Separation of these image layers in the multispectral imaging device in the present disclosure by the approaches described above will restore the image information in different subcutaneous depth and with enhanced image contrast and signal to noise ratio.

Below embodiments of the present disclosure will be described referring to a plurality of figures. It should be stated that a plurality of embodiment described below along with their combinations and varieties, beyond doubt are within the scope of present disclosure.

FIG. 1 is a cross-sectional view of a multispectral imaging device of a first embodiment.

The multispectral imaging device comprises a substrate 190, a first semiconductor layer 140, a second semiconductor layer and a filtering layer, The substrate 190 is a crystal silicon substrate. The first semiconductor layer 140 sensitive to NIR light is arranged on the substrate 190. The first semiconductor layer 140 can be composed of at least one photodiodes or a carrier depletion layer formed by N type semiconductor or P-type semiconductor of CMOS (Complementary Metal Oxide Semiconductor) imaging device, or electrons potential wells or cavity potential wells of CCD (Charge-coupled Device) imaging device. NIR light ranging from 760 nm to 1000 nm are converted photons to electrons by the first semiconductor 140.

The second semiconductor layer 121, 122, 123 are sensitive to visible light and highly transparent for NIR light, and are arranged on one side of the first semiconductor 140 away from the substrate 190. Specifically, visible light ranging from 400 nm to 760 nm can be converted to electrons or holes by the second semiconductor layer. The second semiconductor layer can be formed by various visible light conversion materials and devices, preferably a-SiH photodiodes. Visible light response curve of the a-SiH photodiode matches nicely with the response curve of human vision system, so visible images acquired need little color correction. The a-SiH with an energy band gap approximately from 1.6 eV to 2.0 eV has a large absorption coefficient in visible light, and a much lower absorption coefficient in infrared light. As a matter of fact, an film in 2 micrometers thick can absorb more than 95% of incident visible light, while being almost transparent up to 95% in the NIR light waveband, for the reason that the absorption coefficient in NIR light waveband above 800 nm decreases nearly 100 times compared to the absorption coefficient in light wavelength of 650 nm. When an a-SiH film of 2 micrometers thick is stacked above a NIR light conversion layer, the NIR light passing through the a-SiH film is barely attenuated. In other words, a-SiH photodiodes can convert most of visible light to electrons, and allow most NIR light to pass through to the first semiconductor layer 140.

Figure 2:
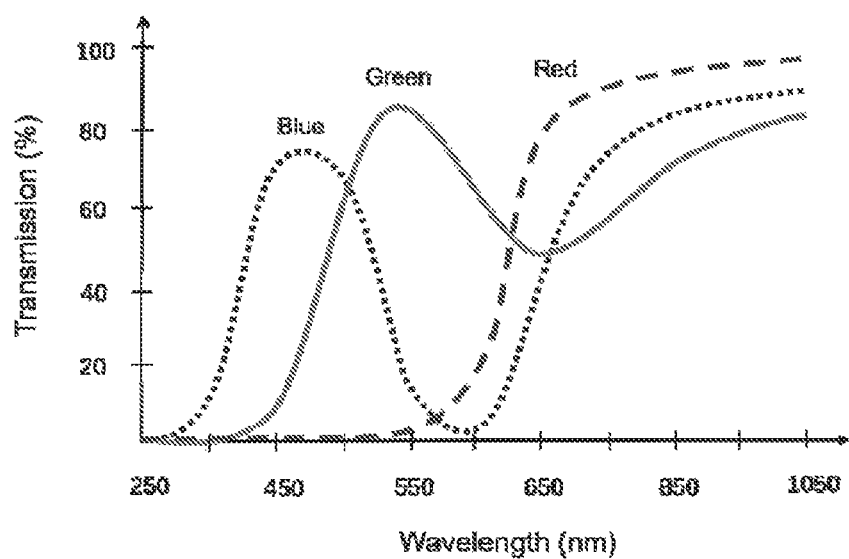
FIG. 2 shows light transmittance curves of different filters according to an embodiment of the present disclosure.

To separate different colors in visible light, and to separate visible light and NIR light, the filtering layer arranged on one side of the second semiconductor layer away from the first semiconductor layer 140 comprises a plurality of filters (such as a blue filter 111 and a red filter 112) arranged as an array. Each filter forms a filtering section transparent for visible light in a specific color band and NIR light. In the embodiment, the plurality of filters comprise hand-pass color filters corresponding to light wavebands with shorter wavelengths (e.g., a blue filter 11 transparent for a light waveband from 400 nm to 460 nm), and band-pass color filters corresponding to light wavebands with longer wavelengths (e.g., a red filter 112 transparent for a light waveband from 650 nm to 760 nm) and a transparent film 113 (e.g., transparent organic film) forming a plurality of filtering sections transparent for visible light and NIR light. The blue filter 111, red filter 112 and transparent film 113 are arranged repeatedly and periodically in two directions (e.g., two orthogonal directions) plane of the substrate, and form an array of filtering sections. Each filtering section corresponds to each of the photodiodes 121, 122 and 123 of the second semiconductor layer respectively. With the arrangement, visible light images in different colors and NIR light image can be separated from each other. FIG. 2 shows the light transmittance curves of different color filters. It can be seen that the color filters are transparent for most infrared light waveband above 760 nm to allow most infrared light to pass through the array of the filtering sections.

Hence, when light irradiating the multispectral imaging device, blue light and NIR light pass through the blue filter 111, red light and NIR light pass through the red filter 112, visible light and NIR light pass through the transparent film, anal all visible light photons are converted to electrons in the corresponding photodiode formed by the second semiconductor layer. NIR light photons pass through the second semiconductor layer and are converted to electrons in the first semiconductor layer 140, and then stored temperately in corresponding storage capacities till the signal charges of the corresponding pixel is read out (e.g., when the first semiconductor layer 140 forms an array of photodiodes) or a reset of pixel potential occurs (e.g., when the first semiconductor layer 140 forms an active pixel sensor).

In the embodiment, the multispectral imaging device further comprises an insulating film 130, arranged between the first semiconductor layer 140 and the second semiconductor layer and at least transparent for NIR light. The insulating film 130 insulates the second semiconductor layer from the first semiconductor layer 140 and decreases the coupling of the stray capacitances between them.

For the sake of simplicity, FIG. 1 only shows related parts of the present disclosure, those skilled in the art can add certain layers or parts according to practical application and process, for example, modifying or adding the electrodes of conversion devices of the second semiconductor layer and corresponding pixel switches; modifying or adding photodiodes in the first semiconductor layer 140 and other related structure of ion implantation and diffusion layer; modifying or adding other electrodes; modifying or adding pixel switches; and modifying or adding data lines and scan lines of signal output and etc. The additions of the components without departing from the basic conception of the present disclosure are beyond doubt within the scope of the present disclosure.

Figure 3:
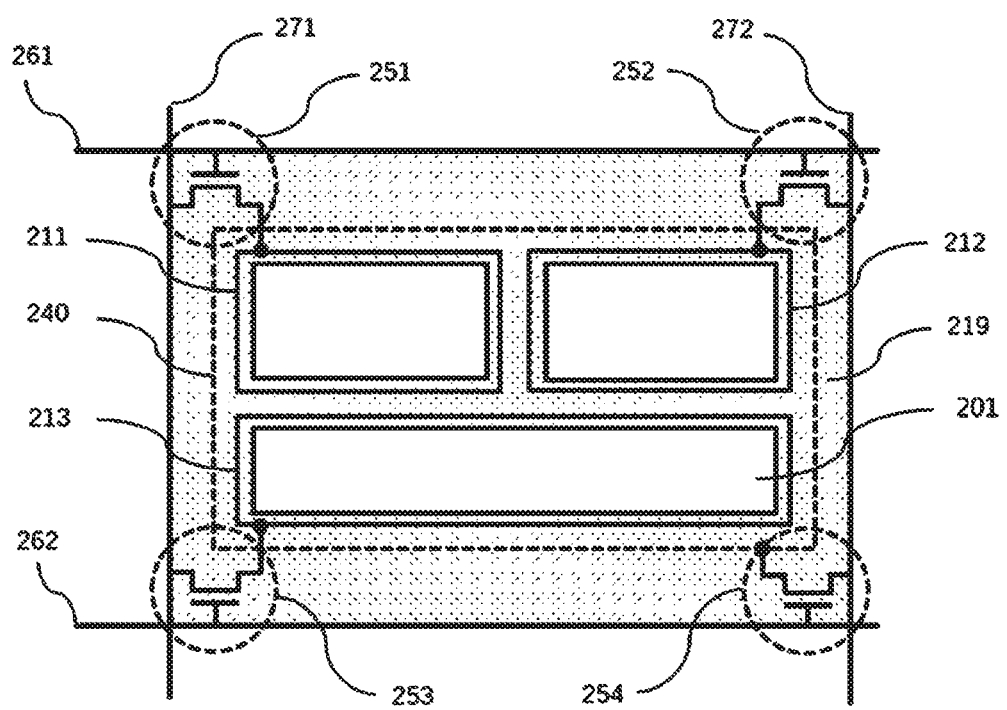
FIG. 3 is a schematic view of a multispectral imaging device according to a second embodiment of the present disclosure.

FIG. 3 is a schematic view of the multispectral imaging device according to a second embodiment. The multispectral imaging device comprises a substrate and further comprises a first semiconductor layer 240, a second semiconductor layer and a filtering layer formed in sequence on the substrate. The unique feature introduced in the second embodiment is that each pattern of the second semiconductor layer comprises a plurality of second sub-patterns arranged as a matrix. Each of the second sub-patterns corresponding to a. photodiode and connected to electrical components forms a visible light subpixel. Each filtering section covers at least one visible light subpixel. Specifically, in the embodiment, the vertical projection of each photodiode of the second semiconductor layer is overlapped correspondingly with each filtering section. For example, the blue filter 211, each of the red filter 212 and the transparent film 213 separately corresponds to a photodiode of the second semiconductor layer. The visible light subpixels can comprise any two or more of red subpixel, blue subpixel, green subpixel, yellow subpixel, magenta subpixel, cyan subpixel, and white or transparent subpixel. Similarly, each pattern of the first semiconductor layer comprises a plurality of first sub-patters arranged as a matrix. Each of the first sub-patterns corresponds to a photodiode and forms a NIR light subpixel. To acquire at least two visible light images in multiple wavebands and at least one NIR light image, at least two visible light subpixels and at least one NIR light subpixel form a pixel. The multispectral imaging device having each pixel arranged as FIG. 3 can acquire a blue light image, a red light image, a white light image and a near infrared light image.

To form a complete structure for collection and transmission of image information, the multispectral imaging device of the embodiment further comprises a plurality of scan lines arranged horizontally and a plurality of data lines arranged vertically on one side of the substrate provided with a plurality of semiconductor layers. Alternatively, the matrix of the above filtering sections, the first sub-patterns and the second sub-patterns are also arranged vertically and horizontally, but not limit the protection scope of the present disclosure. Each of the first sub-patterns is connected electrically to a control electrode of a switch component, and connected to a scan line and a data line through the two electrodes of the switch component, respectively. At least part of the second sub-patterns are connected electrically to a control electrode of a switch component, and connected to a gate line and a scan line through the two electrodes of the switch component, respectively.

Further, in the embodiment, each of the three visible light subpixels in a pixel comprises an a-SiH photodiode formed in the second semiconductor layer. The three photodiodes are overlapped with the blue filter 211, red filter 212 and the transparent film layer 213, respectively. The NM light subpixel of each pixel is a crystal silicon photodiode formed by the first semiconductor layer 240. Each visible light subpixel or NIR light subpixel is connected to a data line 271 or 272 by the source electrode and drain electrode of the crystal silicon MOS transistor formed on the substrate. The gate electrodes of the switch component 251 of the blue subpixel and the switch component 252 of the red subpixel are all connected to the scan line 261. The gate electrodes (control electrode) of the switch component 253 of the white subpixel and the switch component 254 of the red subpixel are all connected to the scan line 262. In a specific embodiment, when the switch components are NMOS transistor switches and scan pulses of a high voltage are applied to each scan line in a sequence, the signal charges stored temporarily in each subpixel read out to the data lines in a sequence, and finally be collected by peripheral circuits and processed further.

In the embodiment, to facilitate the collection and transmission of photon-generated charges in the first semiconductor layer, the vertical projection of the photodiode 240 on the plane of the substrate in a complete rectangle shape completely covers the three a-SiH photodiodes of the second semiconductor layer, in the way of every side of the rectangle extending beyond the boundary of the vertical projection of the three a-SiH photodiodes. In that ease, to prevent visible light from leaking through the gaps between the a-SiH photodiode islands and irradiating the photodiode 240, to acquire pure infrared image signal without any stray visible light, an opaque black matrix 219 is placed to block any stray visible light that could irradiate the first semiconductor layer which is not covered by opaque metal wires and the a-SiH film. The aperture 201 of the black matrix 219 shown in FIG. 3 defines the effective opening to incident light for the second semiconductor layer.

Benefit from the highly transparent white subpixel, not only more NIR light reach to the first semiconductor layer 240, but also green light component of RGB color system can be restored. The green light component can be calculated according to the following equations with the following parameters: the spectral response curve of the photodiodes of the second semiconductor layer, the ratios between the areas of the three a-SiH photodiodes, and the output signals thereof, and the quantum efficiencies of the a-SiH photodiodes to red, blue and green colors.

$$\begin{cases} S_R = T_R \cdot \eta_R \cdot P_R \cdot A_R \\ S_B = T_B \cdot \eta_B \cdot P_B \cdot A_B \\ S_W = (\eta_R \cdot P_R + \eta_B \cdot P_B + \eta_G \cdot P_G) \cdot A_W \end{cases}$$

In the above equation system, parameters $S_R$, $S_B$ and $S_W$ represent the output signals of red, blue and white subpixels, separately; parameter $T_R$ and $T_B$ represent the transmittances of red filter and blue filter, respectively, and their values can be Obtained from the transmittance curve in FIG. 2; parameters $\eta_R$, $\eta_B$ and $\eta_G$ represent the quantum efficiencies of the a-SiH photodiodes to red, blue and green light, respectively; parameters $P_R$, $P_B$, $P_G$ represent the light intensities of unit area of red, blue and green light, respectively; parameters $A_R$, $A_B$, $A_W$ represent the effective apertures of red, blue and white subpixels to the incident light, respectively. In the above equation, the values of all parameters can be measured in advance or extracted from the output signals except for the values of the parameters $P_R$, $P_B$ and $P_G$. Three independent equations with three unknown variables suggests that real solutions exist, or in other words, independent RGB three color system can be restored. One possible variety of the embodiment is to replace the transparent film 213 with a green filter, so to simplify the restoring process for the original color system.

Figure 4:
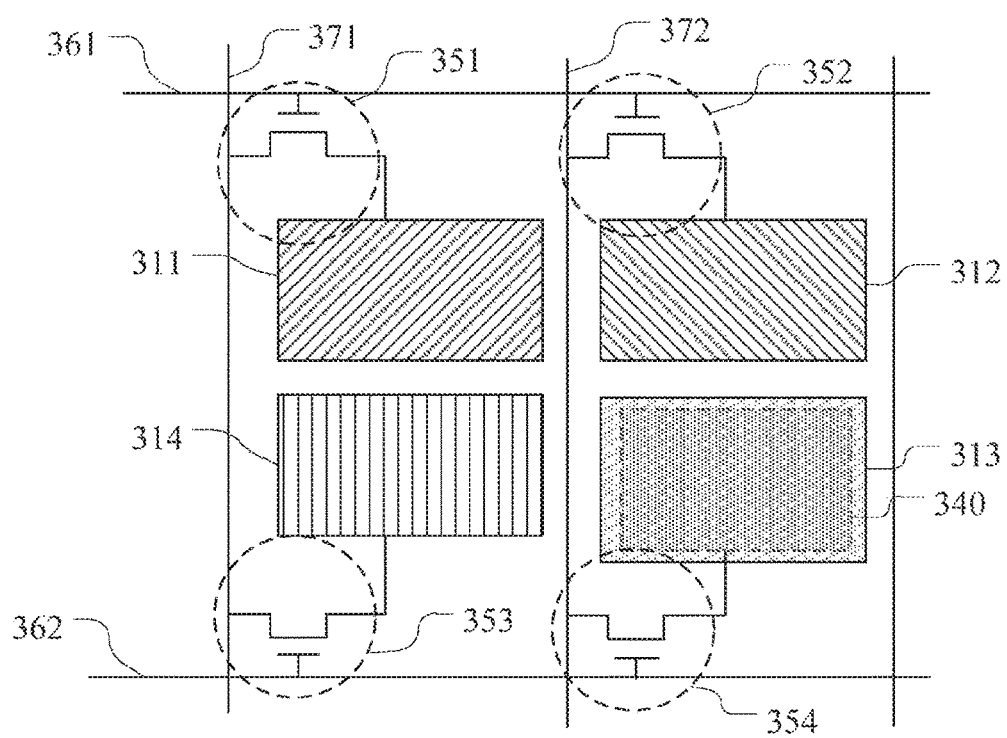
FIG. 4 is a schematic view of a multispectral imaging device according to a third embodiment of the present disclosure.

FIG. 4 is a schematic view of a multispectral imaging device of a third embodiment of the present disclosure. Similar o the second embodiment shown in FIG. 3, the multispectral imaging device comprises a substrate, and further comprises a first semiconductor 340, a second semiconductor and a filtering layer stacked on the substrate in a sequence, and further comprises a plurality of scan lines and data lines.

One unique feature introduced in the embodiment is that the filtering layer comprises a blue filter 311, a red filter 312, a transparent film 313 and a green filter 314 corresponding to the pixel shown in FIG. 4. The vertical projection of each of the filtering sections formed of the filters and the transparent film completely covers each corresponding photodiode of the second semiconductor layer. For the sake of simplicity, here the vertical projection of each filtering section is described to be overlapped with each corresponding photodiode, and each filtering section is shown in a same outer contour with their corresponding photodiode in FIG. 4.

In the embodiment, each subpixel further comprises a switch component. The source electrode of a switch component 351 is connected to a data line 371, the drain electrode of the switch component 351 is connected to the photodiode of the second semiconductor layer overlapped with the blue filter 311, and the gate electrode of the switch component 351 is connected to a scan line 361, to form a blue subpixel. The source electrode of a switch component 352 is connected to a data line 372, the drain electrode of the switch component 352 is connected to the photodiode of the second semiconductor layer overlapped with the red filter 312, and the gate electrode of the switch component 352 is connected to the scan line 361, to form a red subpixel. The source electrode of a switch component 353 is connected to the data line 371, the drain electrode of the switch component is connected to the photodiode of the second semiconductor layer overlapped with the green filter 314, and the gate electrode of the switch component 353 is connected to a scan line 362, to form a green subpixel. The photodiode of the second semiconductor layer overlapped with the transparent film 313 is electrically floating.

Corresponding to the pixel, the vertical projection of the photodiode of the first semiconductor layer 340 on the substrate is smaller than and completely covered by the photodiode of the second semiconductor layer overlapped with the transparent film 313, and not overlapped with each photodiode of the second semiconductor layer connected electrically to the switch components. The source electrode of a switch component 354 is connected to the data line 372, the drain electrode of the switch component 354 is connected to the photodiode of the first semiconductor layer 340, and the gate electrode of the switch. component 354 is connected to the scan line 362, to form a NIR light subpixel. One role of the transparent film 313 is to form an aperture for a transparent subpixel, another role is to planarize the surface of the imaging device. During the manufacturing process, the transparent film 313 can be coated by spin-coater or linear coater on the entire imaging device after filters processes, and then patterned through lithography and thermally baked. In this embodiment, the boundary of the transparent film 313 is not limited to cover a single subpixel, but can extend to cover multiple subpixels, even to cover the sections accepting light of the entire imaging device, to fill the gaps between the filter islands. Further, considering the high transmittance of the color filters to infrared light, the transparent film 313 in the embodiment can also be replaced by any color filter, such as the red filter 312 in order to reduce one lithography step.

Shown in FIG. 4, in the embodiment, each pixel unit comprises a blue light subpixel, a red light subpixel, a green light subpixel and a NIR subpixel. The NIR subpixel is not overlapped with any one of the three visible light subpixels and their components. The multispectral imaging device can acquire R, G, B and NIR, four images at the same time and independently.

Furthermore, in the embodiment, as the photodiode of the first semiconductor 340 is not overlapped with any visible light photodiode formed in the second semiconductor layer, the capacitance of each visible light photodiode is reduced, random noise originated from the stray capacitance of the photodiodes (e.g. KTC noise) is reduced accordingly, signal crosstalk originated from the stray capacitance is reduced as well.

Figure 5:
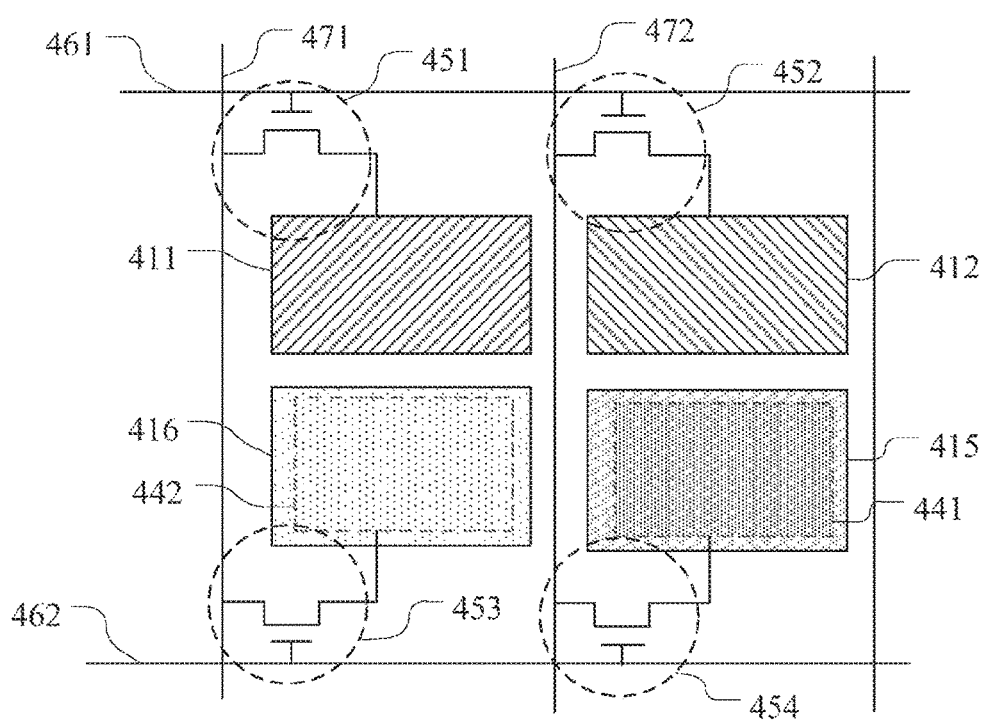
FIG. 5 is a schematic view of a multispectral imaging device according to a fourth embodiment of the present disclosure.

FIG. 5 is a schematic view of a multispectral imaging device according to a fourth embodiment. Similar to the third embodiment shown in FIG. 4, the multispectral imaging device comprises a substrate and further comprises a first semiconductor, a second semiconductor and a filtering layer stacked on the substrate in sequence, and farther comprises a plurality of scan lines and data lines, One unique feature introduced in the fourth embodiment is that the filtering layer comprises a blue filter 411, a red filter 412, an infrared filter 415 and a transparent film 416 corresponding to the pixel shown in FIG. 5. The vertical projection of each of the filtering sections formed of the filters and the transparent film completely covers each corresponding photodiode of the second semiconductor layer. For simplicity, here each filtering section is drawn by the same outline of the corresponding photodiode in FIG. 5. The infrared light filter 415 allows infrared light from 760 nm to 900 nm to pass through. The transparent film 416 is highly transparent for both visible light and NIR light.

In the embodiment, each subpixel further comprises a switch component. The source electrode of a switch component 451 is connected to a data line 471, the drain electrode of the switch component 451 is connected to the photodiode of the second semiconductor layer overlapped with the blue filter 411, and the gate electrode of the switch component 451 is connected to a scan line 461, to form a blue subpixel. The source electrode of a switch component 452 is connected to a data line 472, the drain electrode of the switch component 452 is connected to the photodiode of the second semiconductor layer overlapped with the red filter 412, and the gate electrode of the switch component 452 is connected to the scan line 461, to form a red subpixel. The photodiode of the second semiconductor layer overlapped with the transparent film 416 is electrically floating.

The vertical projections of the photodiodes formed by the first semiconductor layer on the substrate are overlapped with the photodiodes formed by the second semiconductor which are overlapped with the infrared filter 415 and the transparent film 416, and are not overlapped with other photodiodes formed by the second semiconductor. The photodiodes formed by the first semiconductor layer form two NIR subpixels in the pixel unit. The source electrode of a switch component 454 is connected to the data line 472, the drain electrode of the switch component 454 is connected to the photodiode 441 formed by the first semiconductor layer overlapped with the infrared filter 415, and the gate electrode of the switch component 454 is connected to a scan line 462, to form a first NIR subpixel. The source electrode of a switch component 453 is connected to the data line 471, the drain electrode of the switch component 453 is connected to the photodiode 442 formed by the first semiconductor layer overlapped with the transparent film 416, and the gate electrode of the switch component 453 is connected to the scan line 462, to form a second NIR subpixel.

In the embodiment, each pixel unit is formed by a blue light subpixel, a red light subpixel, and two NIR subpixels in two wavebands, to acquire B, R images and two NIR light images at the same time.

Specifically, the detection process of the photodiode connected to the switch component 454 can be described in two steps: in the first step, the infrared filter 415 filters out part of NIR light waveband from 760 nm to 900 nm, and secondly, the a-SiH photodiode overlapped with the infrared filter 415 filters out all visible light, therefore the photodiode formed by the first semiconductor only acquires first image information carried by NIR light waveband above 900 nm. The detection process of the photodiode connected to the switch component 453 can also be described in two stages: in the first step, almost all NIR light passes through the transparent film 416, secondly, the photodiode overlapped with the transparent film 416 filters out all visible light, and the photodiode of the first semiconductor layer acquires second image information carried by NIR light waveband above 760 nm. Therefore, by subtracting the first image information from the second image information based on a certain weight, the image information carried by infrared light waveband from 760 nm to 900 nm can be acquired.

A second way to realize the detection of the two NIR wavebands is to replace the transparent film 416 with a filter blocking infrared light waveband above 900 nm, so that the photodiode of the first semiconductor layer connected to the switch 453 acquires the image information of infrared light waveband from 760 nm to 900 nm directly.

A third way to realize the detection of the two NIR wavebands is to replace the filters 416 and 415 with transparent films, to allow all infrared light to pass through. Therefore, image information carried by longer NIR waveband and shorter NIR waveband can be acquired by two photodiodes formed by the first semiconductor layer with different thickness, respectively. Specifically, shown in FIG. 8, the thicker the light doped layer of N-type is, the more light of longer NIR waveband is absorbed. The photodiode connected to the switch 453 has a thickness from 0.5 micrometer to 3 micrometers to detect NIR light waveband from 760 nm to 900 nm. The photodiode connected to the switch 454 has a thickness, from 1 micrometer to 15 micrometers, larger than the former to detect NIR light waveband from 760 nm to 1000 nm or even longer. By subtracting one of the two output signals of the two photodiodes from the other, images in two different wavebands can be acquired. A process of ion implantation needs to be added to acquire different doping depths of the first semiconductor. In some cases, providing transparent films instead of the filters 416 and 415 is easier to be implemented than providing precise filters 416 and 415, When collecting the image information carried by the light reflected or absorbed by subcutaneous tissues, not only the visible waveband is divided into two colors, i.e., blue and red, but also the NIR light waveband is divided into two wavebands, i.e., a waveband from 760 nm to 900 nm and a waveband from 900 nm to 1100 nm. The image information in the four wavebands are acquired by four subpixels and transferred to external circuits to be processed by wavebands, and then get at least four images of four cross sections with different depths can be acquired to represent more details of the subcutaneous tissues and to guide the relative medical treatment.

Figure 6:
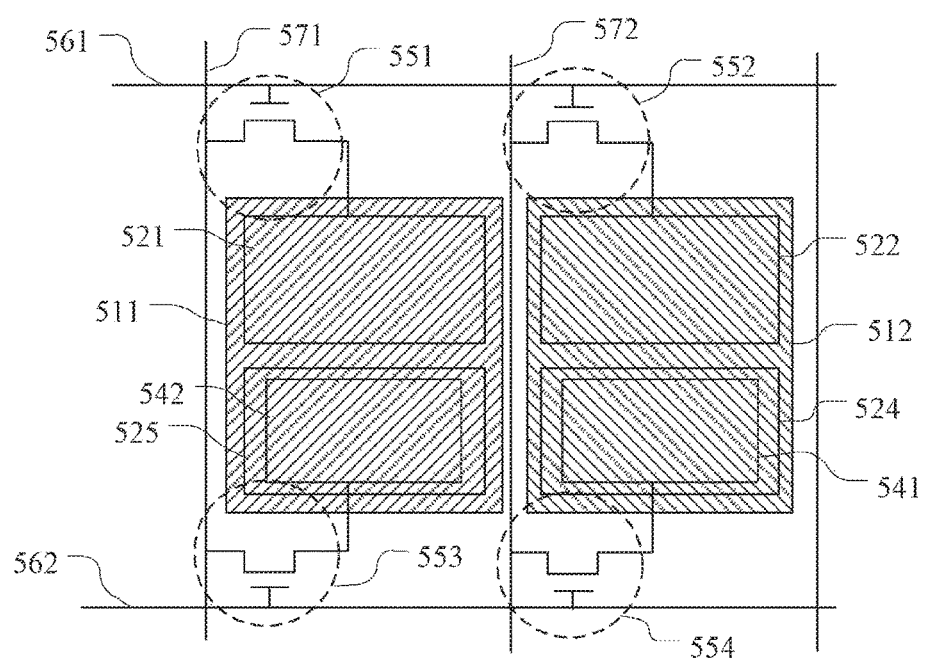
FIG. 6 is a schematic view of a multispectral imaging device according to a fifth embodiment of the present disclosure.

FIG. 6 is a schematic view of a multispectral imaging device according to a fifth embodiment. Similar to the second embodiment shown in FIG. 3, the multispectral imaging device comprises a substrate, and further comprises a first semiconductor layer, a second semiconductor layer and a filtering layer stacked on the substrate in a sequence, and farther comprises a plurality of scan lines and data lines.

One unique feature introduced in the fifth embodiment is that the filtering layer comprises a blue filter 511 and a red filter 512 corresponding to the pixel shown in FIG. 6. In the embodiment, fewer filters are adopted and the vertical projection of each filter covers more than one photodiodes formed by the second semiconductor layer. Shown in FIG. 6, the vertical projection of the blue filter 511 covers the photodiodes 521, 525 formed by the second semiconductor layer, and the vertical projection of the red filter 512 covers the photodiodes 522, 524 formed by the second semiconductor layer.

In the embodiment, each subpixel comprises a switch component. The source electrode of a switch component 551 is connected to a data line 571, the drain electrode of the switch component 551 is connected to the photodiode 521, and the gate electrode of the switch component 551 is connected to a scan line 561, to form a blue subpixel. The source electrode of a switch component 552 is connected to a data line 572, and the drain electrode of the switch component 552 is connected to the photodiode 522, and the gate electrode of the switch component 552 is connected to the scan line 561, to form a red subpixel. The photodiodes 525 and 524 of the second semiconductor layer are electrically floating.

The photodiodes 541 and 542 of the first semiconductor layer are not overlapped with the photodiodes 551, 552 of the second semiconductor, and correspond to the photodiodes 525 and 524, respectively. The photodiodes 541 and 542 form two NIR subpixels. The source electrode of a switch component 554 is connected to the data line 572, the drain electrode of the switch component 554 is connected to the photodiode 541, and the gate electrode of the switch component 554 is connected to a scan line 562, to form a first NIR subpixel. The source electrode of a switch component 553 is connected to the data line 571, the drain electrode of the switch component 553 is connected to the photodiodes 542, and the gate electrode of the switch component 553 is connected to the scan line 562, to form a second NIR subpixel.

Therefore, in the embodiment, each pixel unit comprises a blue subpixel, a red subpixel and two NIR subpixels. The multispectral imaging device can acquire B, R images and two NIR images at the same time.

Specifically, in the embodiment, by changing the species and adjusting the quantity of the pigments doped in the color filters, the transmittance of the red filter and the blue filter for NIR light of shorter wavelength can be adjusted, so the red filter and blue filter can also cover the two photodiodes 541 and 542. As each of the red filter and blue filter covers two photodiodes of the second semiconductor layer, two film coatings and two photolithography processes can be omitted to simplify the manufacturing process.

Figure 7:
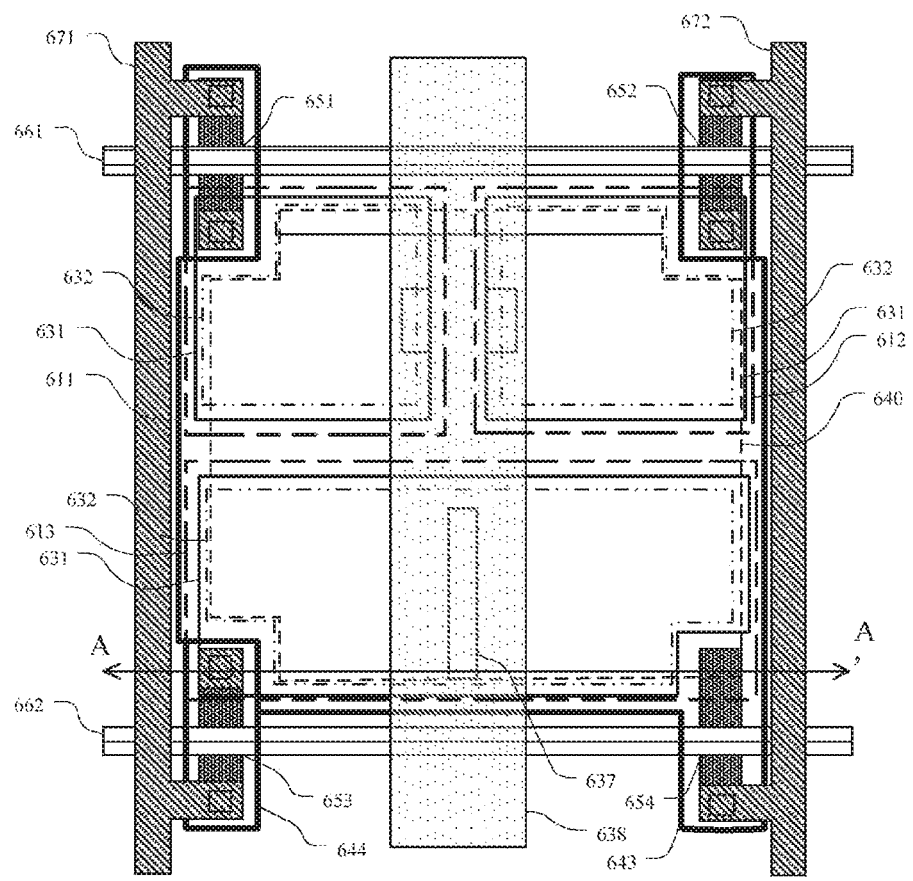
FIG. 7 is a schematic of a multispectral imaging device according to a. sixth embodiment of the present disclosure.
Figure 8:
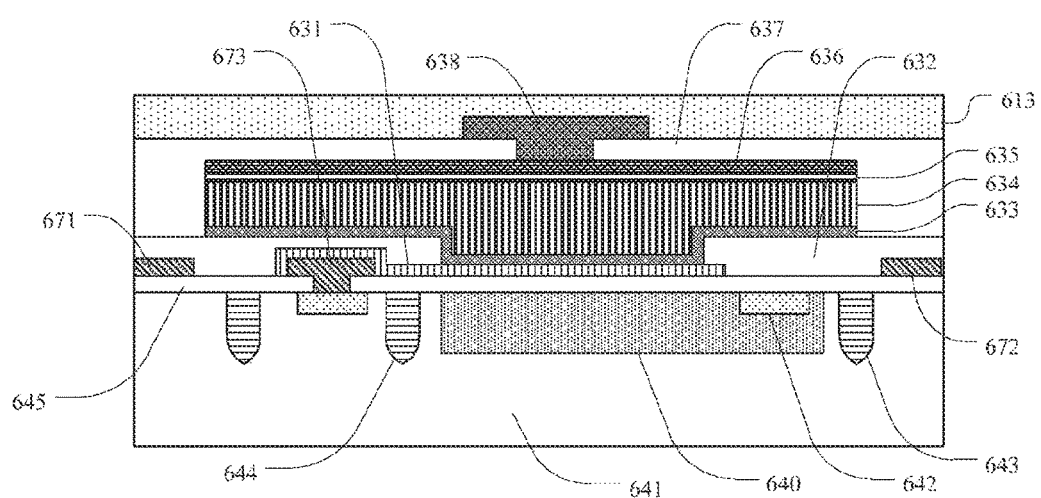
FIG. 8 is a cross-sectional view taken along A-A' direction in FIG. 7.

FIG. 7 is a schematic vies of a multispectral imaging device of a sixth embodiment of the present disclosure. FIG. 8 is a cross-sectional view taken following A-A' direction of FIG. 7.

One unique feature introduced in the sixth embodiment is to further implement the embodiment shown in FIG. 2 with semiconductor devices.

In the embodiment, each of the switch components 651, 652, 653, 654 made on a silicon substrate 641 is a NMOS-FET (metal-oxide -semiconductor field effect transistor of N type). The scan line 661 formed by polycrystalline silicon controls the two subpixels on a first line (the red subpixel and the blue subpixel arranged on the plane of the substrate 641). The scan line 662 of the polycrystalline silicon controls the switch components 653, 654 of the two subpixels on a second line (the white subpixel and the red subpixel arranged in a direction perpendicular to the substrate 641). The data lines 671 and 672 are connected to the source electrodes of these switch components in a longitudinal direction on the plane of the substrate 641, respectively, and transfer the signals to external circuits for signal amplification and processing (not shown).

To reduce the interferences between different signal sources, and reduce the dark current from surrounding semiconductors collected by a charge storage layer, a STI (shallow trench isolation) groove 644 surrounds the switch components 651, 652 and 653 of the three subpixels of visible light and protects them, while another STI groove 643 surrounds a photodiode 640 formed by the first semiconductor and a switch component 654 connected to the photodiode 640 and isolates them from surrounding semiconductor materials and devices. One possible variety of the embodiment is to replace the STI groove 643 with isolation strips heavily doped of P type. By this arrangement, when the devices are actuated, all isolation strips are applied with a fixed potential, and form electronic barriers to isolate all the photodiodes and the N+ diffusion layers connected to the photodiodes. The three a-SiH photodiodes collecting visible light are made by photolithography technique to independent islands, so there is no extra isolating wall between them needed, but an isolating film 637 on the top with the functions of both planarization and passivation isolates each a-SiH photodiode island. The electrode 631 on the bottom of the a-SiH photodiode is a transparent electrode transparent for infrared light, such as ITO film in 50 nm~200 nm thick. Another possible variety of the embodiment is to use an a-SiH film highly conductive, heavily doped of N+ type or P+ type, and in a certain thickness as the electrode 631.

To acquire sufficient transverse conductivity to quickly collect the photo-generated charges from the surrounding and to reduce the disconnection probability of the conductive path on the step edge, the thickness of N+ doped or P+ a-SiH film should be larger than 50 nm. Shown in FIG. 7, in the case of adopting a-SiH film of N+ or P+ type as the lower electrode 631 of the a-SiH photodiode, an interlayer 632 with insulation function could be omitted to simplify the processing steps. However, the speed ratio of etching the a-SiH photodiodes relative to etching the field oxide layer 645 needs to be high enough, and the thickness of the field oxide layer 645 needs to be large enough, e.g., larger than 100 nm.

Shown in FIG. 8, reference numbers 633-636 refer to different layers of the photodiodes of the second semiconductor layer corresponding to the transparent film 613 in FIG. 7, respectively. Reference number 633 refers to a heavy doped layer of N+ type on the bottom of the a-SiH photodiode and in 30 nm~100 nm thick. Reference number 634 refers to an un-doped layer in 1 micrometer to 2 micrometers thick, and converting visible light photons to electron-hole pairs. Reference number 635 refers to a heavy doped layer of P+ type on the top, absorbing light and not converting light photons to electrons. As the films thicker than 100 nm significantly absorb incident light of short wavelength, films thinner than 20 nm will cause a sharp increase of dark current injected from the top electrodes. Therefore, the heavy doped layer 635 preferably has a thickness from 30 nm to 100 nm. Reference number 636 refers to a transparent conductive film on the top, e.g. an ITO film. Reference number 638 refers to conductive metal or metallic oxide (e.g. ITO) connected to the transparent conductive films on the top of the a-SiH photodiodes and arranged in a longitudinal direction in series. The transparent film 613 can be the same with the transparent film 213 in FIG. 2. Reference number 673 refers to a source electrode of a NMOS FET. A photodiode 640 of the first semiconductor layer can be a light doped layer of N type formed on the substrate 41 (e.g., a crystal silicon substrate of P type), and can form a deeper N Well after the charges therein are depleted, and therefore more suitable to detect NIR light with deeper absorption depth. In three visible light subpixels, each N type doped layer 642 in the NMOS FET is connected to the source electrode. The light doped layer 640 of N type and the heavy doped layer 642 of N type are both in floating state during the period of charge generation and the period of accumulation, and the positions thereof vary as the charge accumulates, so they are also called FD (floating diffusion) layer. The diffusion layers of drain electrode of all NMOS FETs are connected to the drain electrodes, and then are connected to the data lines to be kept in a certain potential.

According to the above embodiments, the second semiconductor layer and the first semiconductor layer are overlapped with each other along the light path, but realize the functions of light absorption and light conversion respectively and do not influence the functions of charge storage and information transmission of each other. The present disclosure provides effective approaches and device structures for acquiring multispectral images. The level of medical imaging diagnosis and treatment can be improved significantly by acquiring multispectral images, especially infrared images of subcutaneous tissues effectively, portably and accurately.

It should be stated that, the embodiments described previously are representing one or several aspects in arrangements, combinations and features of the present disclosure, but not limit the scope of the present disclosure. For example, the arrangements, combinations of subpixels and the connection relationships of the subpixels, the data lines and the scan lines are not limited to this. The semiconductor devices shown in the figures include at least four technical aspects: circuits and structure; manufacture process flow and processing parameters; materials of semiconductors, metals and insulating films; actuating methods in actual use. The contents disclosed in the four aspects and with various combinations or varieties thereof, should all be understood to be in accordance with the basic conception of the present disclosure. Other semiconductor materials, include polycrystal silicon, microcrystal silicon, amorphous selenium, semiconductor of III-V system, semiconductor of II-IV system, metal oxide semiconductor, and etc. can be used to replace the a-SiH as the visible light conversion material. The transistors in each subpixel may also be replaced by low temperature polycrystal silicon TFT (LIPS TFT), metal oxide semiconductor such as IGZO TFT, CdTe TFT, organic semiconductor TFT, and etc.

Figure 9:
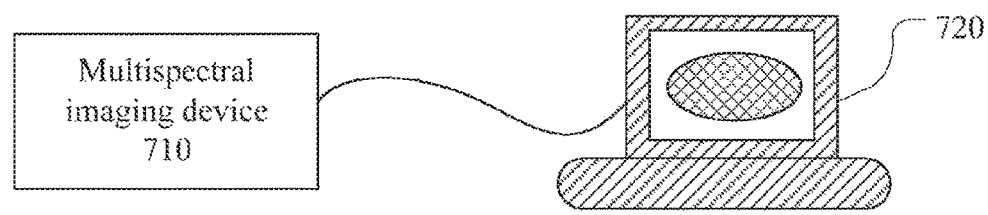
FIG. 9 is a schematic view of a multispectral imaging system according to an embodiment of the present disclosure.

FIG. 9 is a schematic view of a multispectral imaging system according to an embodiment of the present disclosure. The multispectral imaging system comprises the multispectral imaging device 710 according to any embodiment of FIG. 1 to FIG. 8 and a processor 720. The multispectral imaging device 710 converts the incident light into electric signals comprising the multispectral image information. The processor 720 communicates with the multispectral imaging device 710 and processes the electric signals acquired from the multispectral imaging device 710. Alternatively, the processor 710 processes the electric signals by performing addition and subtraction operations with a certain weight, to acquire images with high contrast of subcutaneous tissues at different depths.

In summary, the multispectral imaging device and multispectral imaging system of the present disclosure separate the incident light to a plurality of light beams by waveband in a direction perpendicular to the substrate and a direction parallel to the substrate, to acquire multispectral images at the same time.

The basic concept and a plurality of embodiments of the present disclosure are described above. Here a statement need to be made that the present disclosure is not limited by the above specific embodiments, the person skilled in the art may make all kinds of transformations and amendments and combinations within the scope of claims, which will not influence the actual contents of the present disclosure. The present disclosure is also not limited to medical imaging application as described in the present disclosure, it may also be used in other fields such as industrial and agriculture products, environment monitoring and diagnosis, recognition of personal identity, instruments in gaming industry, virtual reality and augmented reality and etc.

What is claimed is:

1. A multispectral imaging device, wherein, said multispectral imaging device acquires multispectral images and comprises:
a substrate;
a plurality of semiconductor layers, stacked on said substrate and arranged in a direction perpendicular to the substrate, different semiconductor layers converting visible light photons and NIR light photons to electrons, respectively; and
a filtering layer, arranged on one side of said plurality of semiconductor layers away from said substrate, comprising a plurality of filtering sections arranged as a matrix, to separate incident light to multiple wavebands on a plane parallel to said substrate;
said plurality of semiconductor layers comprises:
a first semiconductor layer, arranged on said substrate, to convert NIR light photons to electrons; and
a second semiconductor layer, arranged on one side of said first semiconductor layer away from said substrate, to convert visible light photons to electrons, and transparent for the NIR light;
said filtering layer is arranged on one side of said second semiconductor layer away from said first semiconductor layer, said filtering layer comprises a plurality of filters arranged as an array, and each said filter forms a filtering section and is transparent for a specific waveband of visible light or NIR light;
each pattern formed by said second semiconductor layer comprises a plurality of second sub patterns arranged as a matrix, each of said second sub patterns connected to an electrical component to form a visible light subpixel, and each of said filtering section covers at least one visible light subpixel;
each pattern formed by said first semiconductor layer comprises a plurality of first sub patterns arranged as a matrix, each of said first sub patterns forms a NIR light subpixel;
at least two visible light subpixels of different wavebands and at least one NIR light subpixel form a pixel, therefore said multispectral imaging device acquires at least two visible light images in different wavebands and at least one NIR light image.

2. The multispectral imaging device according to claim 1, wherein, a vertical projection of patterns formed by said second semiconductor layer on the plane of said substrate completely covers a vertical projection of patterns formed by said first semiconductor layer on the plane of said substrate.

3. The multispectral imaging device according to claim 1, wherein, the vertical projection of the patterns formed by said second semiconductor layer on the plane of said substrate covers part of vertical projection of the patterns formed by said first semiconductor layer on the plane of said substrate,
said multispectral imaging device further comprises:
a black matrix film and other opaque metals, to completely cover a part of the patterns formed by said first semiconductor layer not covered by the patterns formed by said second semiconductor layer, to block the visible light from passing through gaps between the patterns formed by the second semiconductor layer to irradiate the first semiconductor layer.

4. The multispectral imaging device according to claim 1, wherein, a part of patterns formed by said second semiconductor layer are connected to electrical components, and the other part of said patterns formed by said second semiconductor layer are electrically floating.

5. The multispectral imaging device according to claim 4, wherein, a vertical projection of the patterns formed by said first semiconductor layer on the plane of the substrate is not overlapped with a vertical projection of the patterns formed by said second semiconductor layer connected to the electrical components on the plane of the substrate.

6. The multispectral imaging device according to claim 1, wherein, a vertical projection of each filtering section on the plane of the substrate completely covers a vertical projection of patterns formed by said second semiconductor on the plane of said substrate.

7. The multispectral imaging device according to claim 1, wherein, said filtering layer further comprises: a transparent film, forming a plurality of filtering sections, and transparent for the visible light and the NIR light.

8. The multispectral imaging device according to claim 7, wherein, said transparent film covers gaps between a plurality of filtering sections, to planarize a top surface of said multispectral imaging device.

9. The multispectral imaging device according to claim 1, wherein, each pixel comprises three visible light subpixels of multiple wavebands and one NIR light subpixel, therefore said multispectral imaging device acquires three visible light images in multiple wavebands and one NIR light image.

10. The multispectral imaging device according to claim 1, wherein, each said pixel comprises two visible light subpixels of different wavebands and two NIR light subpixels of different wavebands, therefore said multispectral imaging device acquires two visible light images in different wavebands and two NIR light images in different wavebands.

11. The multispectral imaging device according to claim 10, wherein, two NIR light subpixels of each pixel are covered by a transparent film and a filter opaque to NIR light waveband longer than 900 nm, respectively.

12. The multispectral imaging device according to claim 10, wherein, the patterns formed by the first semiconductor layer corresponding to said two NIR light subpixels have different thicknesses to convert NIR light photons of different wavebands to electrons.

13. The multispectral imaging device according to claim 12, wherein, a part of the first semiconductor layer corresponding to a first NIR light subpixel has a thickness between 0.5 micrometer and 3 micrometers; a part of the first semiconductor layer corresponding to a second NIR light subpixel has a thickness between 1 micrometer and 15 micrometers; and the thickness of the part of the first semiconductor layer corresponding to a second NIR light subpixel is larger than the thickness of the part of the first semiconductor layer corresponding to a first NIR light subpixel.

14. The multispectral imaging device according to claim 1, wherein, each said visible light pixel comprises two or more of the following subpixels:

a red subpixel;
a blue subpixel;
a green subpixel;
a yellow subpixel;
a magenta subpixel;
a cyan subpixel; and
a white subpixel.

15. The multispectral imaging device according to claim 1, wherein, said substrate is a crystal silicon substrate.

16. A multispectral imaging system, comprising:

the multispectral imaging device according to claim 1, to convert the incident light to electrical signals comprising image information of multiple wavebands; and a processor, to communicate with said multispectral imaging device, and process the electrical signals acquired from said multispectral imaging device.

17. The multispectral imaging system according to claim 16, wherein, said processor processes the electrical signals acquired from said multispectral imaging device by performing addition or subtraction operations with a certain weight.

* * * * *